(12) United States Patent
Benjamin

(10) Patent No.: US 7,365,387 B2
(45) Date of Patent: Apr. 29, 2008

(54) GATE-COUPLED EPROM CELL FOR PRINTHEAD

(75) Inventor: Trudy Benjamin, Portland, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/360,801

(22) Filed: Feb. 23, 2006

(65) Prior Publication Data
US 2007/0194371 A1 Aug. 23, 2007

(51) Int. Cl.
*H01L 29/788* (2006.01)

(52) U.S. Cl. ............... 257/320; 257/317; 438/252; 438/211; 438/201; 327/143; 327/347

(58) Field of Classification Search ........... 257/317, 257/320; 438/266, 201, 211, 252; 327/112, 327/143; 347/14, 57; 365/114
See application file for complete search history.

(56) References Cited

U.S. PATENT DOCUMENTS

| | | | |
|---|---|---|---|
| 5,015,885 A * | 5/1991 | El Gamal et al. ............. | 326/38 |
| 5,057,447 A | 10/1991 | Paterson | |
| 5,289,210 A * | 2/1994 | Takayanagi .................. | 347/14 |
| 5,371,698 A * | 12/1994 | Koehler ...................... | 365/114 |
| 5,594,366 A * | 1/1997 | Khong et al. ................. | 326/41 |
| 5,625,211 A * | 4/1997 | Kowshik .................... | 257/317 |
| 5,716,874 A | 2/1998 | Ko et al. | |
| 5,773,862 A * | 6/1998 | Peng et al. ................. | 257/316 |
| 5,856,688 A | 1/1999 | Lee et al. | |
| 5,880,991 A | 3/1999 | Hsu et al. | |
| 5,981,335 A | 11/1999 | Chi | |
| 6,113,208 A | 9/2000 | Benjamin et al. | |
| 6,255,164 B1 | 7/2001 | Liu et al. | |
| 6,325,483 B1 * | 12/2001 | Harbour et al. ............... | 347/19 |
| 6,439,697 B1 | 8/2002 | Axtell et al. | |
| 6,528,842 B1 | 3/2003 | Luich et al. | |
| 6,543,882 B2 | 4/2003 | Axtell et al. | |

(Continued)

FOREIGN PATENT DOCUMENTS

DE 10141962 3/2003

(Continued)

OTHER PUBLICATIONS

William D. Brown, et al., Eds., "Floating Gate Planar Devices" in Nonvolatile Semiconductor Memory Technology, 1998, pp. 102-105, IEEE Press, Piscataway, NJ.

(Continued)

*Primary Examiner*—Jerome Jackson
*Assistant Examiner*—Jami M Valentine

(57) ABSTRACT

An EPROM cell in a printhead control circuit for an inkjet printer, having exactly one polysilicon layer and a conductive layer disposed above the polysilicon layer, includes a control transistor and an EPROM transistor. The control and EPROM transistors each have floating gates comprising a portion of the polysilicon layer, and an electrical interconnection, comprising a portion of the conductive layer, interconnects the floating gate of the control transistor and the floating gate of the EPROM transistor.

20 Claims, 6 Drawing Sheets

U.S. PATENT DOCUMENTS

| | | | |
|---|---|---|---|
| 6,653,183 B2 * | 11/2003 | Hung et al. ................. | 438/211 |
| 6,769,757 B2 | 8/2004 | Skene et al. | |
| 6,794,908 B2 * | 9/2004 | Erstad ........................ | 327/112 |
| 2002/0060722 A1 * | 5/2002 | Axtell et al. ................. | 347/57 |
| 2002/0109535 A1 * | 8/2002 | Caliboso .................... | 327/143 |
| 2004/0036108 A1 | 2/2004 | Rudeck | |
| 2004/0084712 A1 | 5/2004 | Lin et al. | |
| 2004/0223034 A1 | 11/2004 | Feinn et al. | |
| 2005/0231536 A1 | 10/2005 | Benjamin et al. | |
| 2005/0231541 A1 | 10/2005 | Benjamin | |
| 2005/0231545 A1 | 10/2005 | Benjamin et al. | |
| 2005/0231562 A1 | 10/2005 | Torgerson et al. | |
| 2006/0003528 A1 | 1/2006 | Forbes | |

FOREIGN PATENT DOCUMENTS

| | | | |
|---|---|---|---|
| EP | 1081638 A2 * | 3/2001 | |

OTHER PUBLICATIONS

U.S.P.T.O. Office Action for U.S. Appl. No. 11/263,337, mailed Aug. 9, 2007 (5pp).

Claims as currently presented in U.S. Appl. No. 11/263,337 (4pp).

* cited by examiner

GATE-COUPLED EPROM CELL FOR PRINTHEAD

BACKGROUND

An inkjet printing system is a type of fluid ejection device, and includes a printhead, an ink supply, and an electronic controller that controls the printhead. The printhead ejects liquid ink drops through an array of orifices or nozzles disposed in a die by rapidly heating small volumes of ink located in vaporization chambers. The ink is heated with small electric heaters, such as thin film resistors or firing resistors. Heating the ink causes a portion of the liquid ink to vaporize and thereby eject a single drop through the nozzle toward a sheet of print medium, such as a sheet of paper, to print an image. The ink nozzles are typically arranged in one or more arrays in the printhead die, such that properly sequenced ejection of ink from the nozzles causes characters or other images to be printed as the printhead scans across the print medium.

To eject each drop of ink, the electronic controller that controls the printhead activates an electrical current from a power supply external to the printhead. The electrical current passes through a selected firing resistor to heat the ink in a corresponding selected vaporization chamber and eject the ink through a corresponding nozzle. Known drop generators include a firing resistor, a corresponding vaporization chamber, and a corresponding nozzle.

In inkjet printing systems it is desirable to have several characteristics of each print cartridge easily identifiable by a controller, and it is desirable to have such identification information supplied directly by the print cartridge. This "identification information" can provide information to the controller to adjust the operation of the printer and ensure correct operation. Additionally, as the different types of fluid ejection devices and their operating parameters increase, there is a need to provide a greater amount of identification information without adding further interconnections to the flex tab circuit or increasing the size of the die to provide such identification information.

For these and other reasons, pen identification cells have been developed and integrated with the circuitry of inkjet printhead dies. In one configuration, the printhead circuitry is a negative-channel metal-oxide semiconductor (NMOS) circuit, and the identification cells are configured to be addressed individually. Each identification cell includes an identification bit that stores one bit of information.

The identification bits of the identification cells typically employ fuses and, though they are different from standard programmable read-only memory (PROM) chips, these bits are programmed and used in basically the same way. To program the chip, a relatively high current is selectively routed to certain fuses to cause them to burn out. Bits where fuses remain have a value of 1, while those where the fuses have been burned out provide a value of 0 in the binary logic of the circuit.

Programming and using ROM chips in this way has some drawbacks. If a chip is improperly programmed initially, there is no way to fix it, and the chip must be discarded. Additionally, fuses are relatively large, and can be unreliable. In inkjet printhead circuits, for example, fuses can damage the inkjet orifice layer during programming, and after a fuse burns out, metal debris from the fuse can be drawn into the ink and cause blockage in a pen, or result in poor quality printing.

In recent years, electronically programmable read-only memory (EPROM) devices have also been developed. Unlike PROM chips, EPROM chips do not include fuses. Like typical ROM chips, EPROMs include a conductive grid of columns and rows. The cell at each intersection has two gates that are separated from each other by a thin oxide layer that acts as a dielectric. One of the gates is called a floating gate and the other is called a control gate or input gate. The floating gate's only link to the row is through the control gate. A blank EPROM has all of the gates fully open, giving each cell a value of 1. That is, the floating gate initially has no charge, which causes the threshold voltage to be low.

To change the value of the bit to 0, a programming voltage (e.g. 10 to 16 volts) is applied to the control gate and drain. This programming voltage draws excited electrons to the floating gate, thereby increasing the threshold voltage. The excited electrons are pushed through and trapped on the other side of the thin oxide layer, giving it a negative charge. These negatively charged electrons act as a barrier between the control gate and the floating gate. During use of the EPROM cell, a cell sensor monitors the threshold voltage of the cell. If the threshold voltage is low (below the threshold level), the cell has a value of 1. If the threshold voltage is high (above the threshold level), the cell has a value of zero.

Because EPROM cells have two gates at each intersection, an EPROM chip requires additional layers compared to a standard NMOS or PROM chip, including many such chips that are frequently used in inkjet printhead circuits. Consequently, while some of the drawbacks of fuses in NMOS circuits could be eliminated by the application of EPROM circuitry, the use of a typical EPROM cell either requires that the chip be provided with additional layers, which increases the cost and complexity of the chip, or that a separate EPROM chip be provided.

BRIEF DESCRIPTION OF THE DRAWINGS

Various features and advantages of the invention will be apparent from the detailed description which follows, taken in conjunction with the accompanying drawings, which together illustrate, by way of example, features of the invention, and wherein.

DETAILED DESCRIPTION

Figure 1:
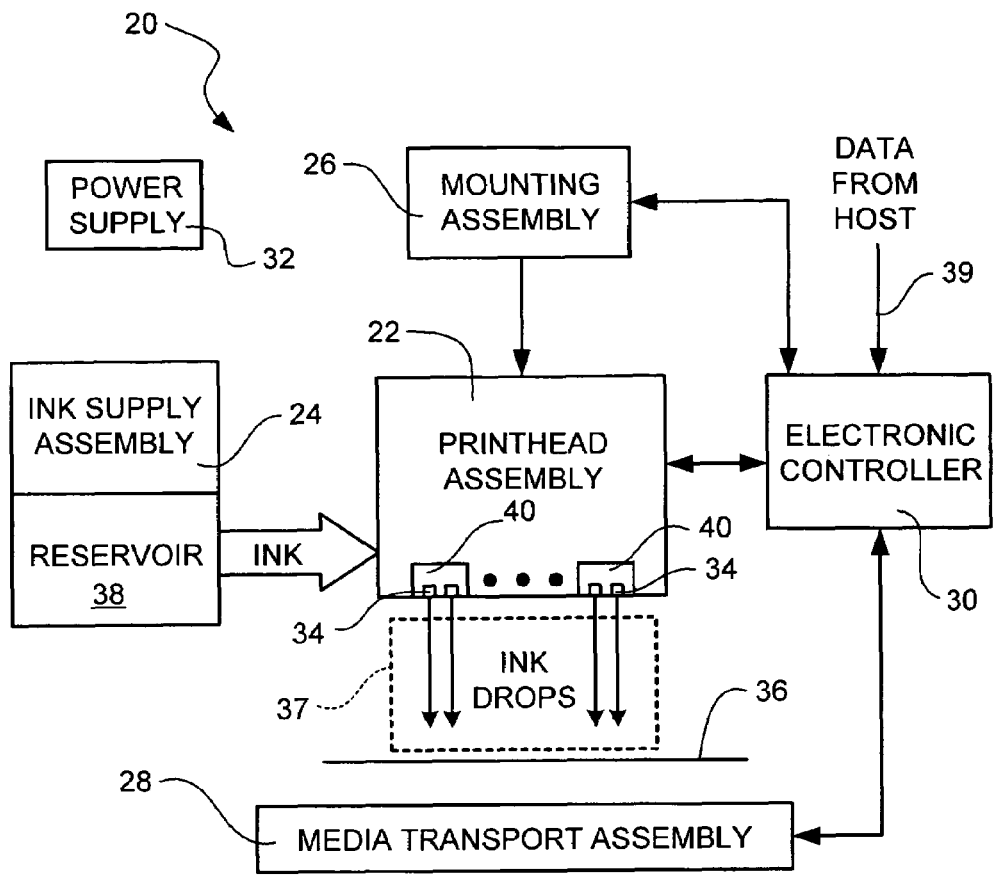
FIG. 1 is a block diagram of one embodiment of an ink jet printing system.

Reference will now be made to exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the invention as illustrated herein, which would occur to one skilled in the relevant art and having possession of this disclosure, are to be considered within the scope of the invention.

Shown in FIG. 1 is a block diagram of one embodiment of an inkjet printing system 20. The inkjet printing system generally includes an inkjet printhead assembly 22, and a fluid supply assembly, such as the ink supply assembly 24. The inkjet printing system also includes a mounting assembly 26, a media transport assembly 28, and an electronic controller 30. A power supply 32 provides power to the various electrical components of the system.

In the embodiment shown in FIG. 1, the inkjet printhead assembly 22 includes at least one printhead or printhead die 40 that ejects drops of ink through a plurality of orifices or nozzles 34 toward a print medium 36, so as to print onto the print medium. The print medium can be any type of suitable sheet material, such as paper, card stock, transparencies, Mylar®, fabric, and the like. Typically, the nozzles 34 are arranged in one or more columns or arrays such that properly sequenced ejection of ink from the nozzles causes characters, symbols, and/or other graphics or images to be printed upon print medium as the inkjet printhead assembly and print medium are moved relative to each other. The printhead 40 is one embodiment of a fluid ejection device. While the following description refers to the ejection of ink from the printhead assembly 22, it is to be understood that other liquids, fluids or flowable materials, including clear fluid, may be ejected from the printhead assembly.

The ink supply assembly 24 is one embodiment of a fluid supply assembly, and provides ink to the printhead assembly 22. The ink supply assembly includes a reservoir 38 for storing ink, which flows from the reservoir to the inkjet printhead assembly. The ink supply assembly and inkjet printhead assembly can form either a one-way ink delivery system or a recirculating ink delivery system. In a one-way ink delivery system, substantially all of the ink provided to the inkjet printhead assembly is consumed during printing. In a recirculating ink delivery system, only a portion of the ink provided to the printhead assembly is consumed during printing. In such a system, ink not consumed during printing is returned to the ink supply assembly.

In one embodiment of an inkjet printing system, the inkjet printhead assembly 22 and ink supply assembly 24 are housed together in an inkjet cartridge or pen. Alternatively, the ink supply assembly can be separate from the inkjet printhead assembly, and provide ink to the inkjet printhead assembly through an interface connection, such as a supply tube (not shown). In either embodiment, the reservoir 38 can be removed, replaced, and/or refilled.

The mounting assembly 26 positions the inkjet printhead assembly 22 relative to the media transport assembly 28, which positions the print medium 36 relative to the inkjet printhead assembly. A print zone 37 is thus defined adjacent to the nozzles 34 in an area between the inkjet printhead assembly and the print medium. The inkjet printhead assembly can be a scanning type printhead assembly, wherein the mounting assembly includes a carriage (not shown) for moving the inkjet printhead assembly relative to the media transport assembly to scan the print medium. Alternatively, the inkjet printhead assembly can be a non-scanning type printhead assembly, wherein the mounting assembly fixes the inkjet printhead assembly at a prescribed position relative to the media transport assembly 28.

The electronic controller or printer controller 30 typically includes a processor, firmware, and other electronics, or any combination thereof, for communicating with and controlling the inkjet printhead assembly 22, the mounting assembly 26, and the media transport assembly 28. The electronic controller receives data 39 from a host system, such as a computer, and usually includes memory (not shown) for temporarily storing the data. Typically, the data is sent to the inkjet printing system 20 along an electronic, infrared, optical, or other information transfer path. The data represents, for example, a document to be printed, and includes one or more print job commands and/or command parameters, thereby forming a print job for the inkjet printing system. The pattern of ejected ink drops is determined by the print job commands and/or command parameters.

The inkjet printhead assembly 22 can include one printhead 40, or it can be a wide-array or multi-head printhead assembly. The inkjet printhead assembly can include a carrier, which carries the printhead dies, provides electrical communication between the printhead dies and electronic controller 30, and provides fluidic communication between the printhead dies and the ink supply assembly 24.

Figure 2:
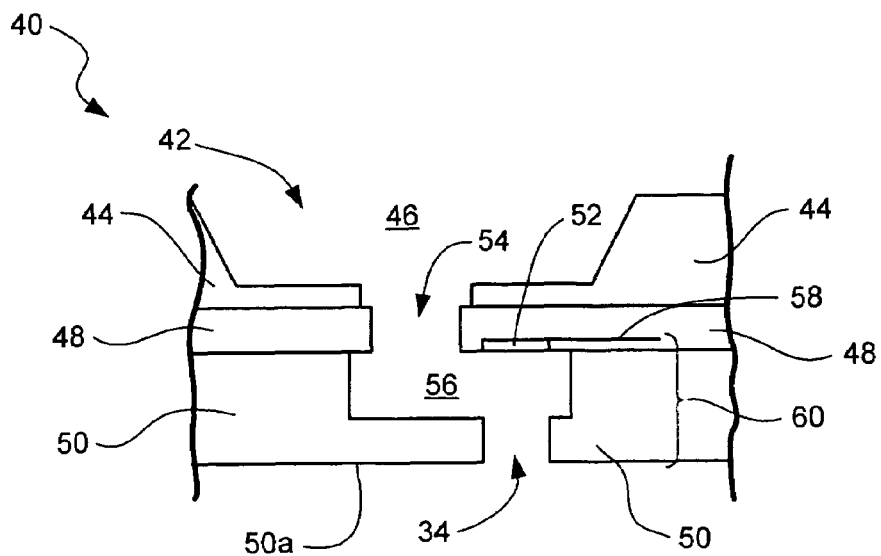
FIG. 2 is a diagram illustrating a portion of one embodiment of a printhead die.

Provided in FIG. 2 is a diagram illustrating a portion of one embodiment of a printhead die 40. The printhead die includes an array of printing or fluid ejecting elements 42. The printing elements are formed on a substrate 44, which has an ink feed slot 46 formed therein. The ink feed slot provides a supply of liquid ink to the printing elements, and is one embodiment of a fluid feed source. Other embodiments of fluid feed sources include but are not limited to corresponding individual ink feed holes feeding corresponding vaporization chambers and multiple shorter ink feed trenches that each feed corresponding groups of fluid ejecting elements.

A thin-film structure 48 is provided with an ink feed channel 54 formed therein. This channel communicates with the ink feed slot 46 formed in the substrate 44. An orifice layer 50 has a front face 50a and a nozzle opening 34 formed in the front face. The orifice layer also has a nozzle chamber or vaporization chamber 56 formed therein, which communicates with the nozzle opening and the ink feed channel of the thin-film structure. A firing resistor 52 is positioned within the vaporization chamber, and conductive leads 58 electrically couple this firing resistor to circuitry controlling the application of electrical current through selected firing resistors. As used herein, the term "drop generator" 60 includes the firing resistor 52, the nozzle chamber or vaporization chamber 56 and the nozzle opening 34.

During printing, ink flows from the ink feed slot 46 to the vaporization chamber 56 via the ink feed channel 54. The nozzle opening 34 is operatively associated with the firing resistor 52, such that droplets of ink within the vaporization chamber are ejected through the nozzle opening (e.g., substantially normal to the plane of the firing resistor) and toward the print medium 36 upon energizing of the firing resistor.

There are a variety of types of printhead dies. These include thermal printheads, piezoelectric printheads, electrostatic printheads, and any other type of fluid ejection device known in the art that can be integrated into a multi-layer structure. The substrate 44 can be formed, for example, of silicon, glass, ceramic, or a stable polymer, and the thin-film structure 48 can be formed to include one or more passivation or insulation layers of silicon dioxide, silicon carbide, silicon nitride, tantalum, polysilicon glass, or other suitable material. The thin-film structure also includes at least one conductive layer, which defines the firing resistor 52 and leads 58. The conductive layer can be made of, for example, aluminum, silver, gold, tantalum, tantalum-aluminum, or other metal or metal alloy. Firing cell circuitry, such as described in detail below, can be implemented in the substrate and thin-film layers.

The orifice layer 50 can be of a photoimageable epoxy resin, such as an epoxy referred to as SU8, marketed by Micro-Chem, of Newton, Mass. Techniques for fabricating the orifice layer with SU8 or other polymers are well known to those of skill in the art. In one embodiment, the orifice layer is formed of two separate layers, referred to as a barrier layer (e.g., a dry film photo resist barrier layer) and a metal orifice layer (e.g., a nickel, copper, iron/nickel alloys, palladium, gold, or rhodium layer) formed over the barrier layer. Other suitable materials can also be employed to form the orifice layer.

Figure 3:
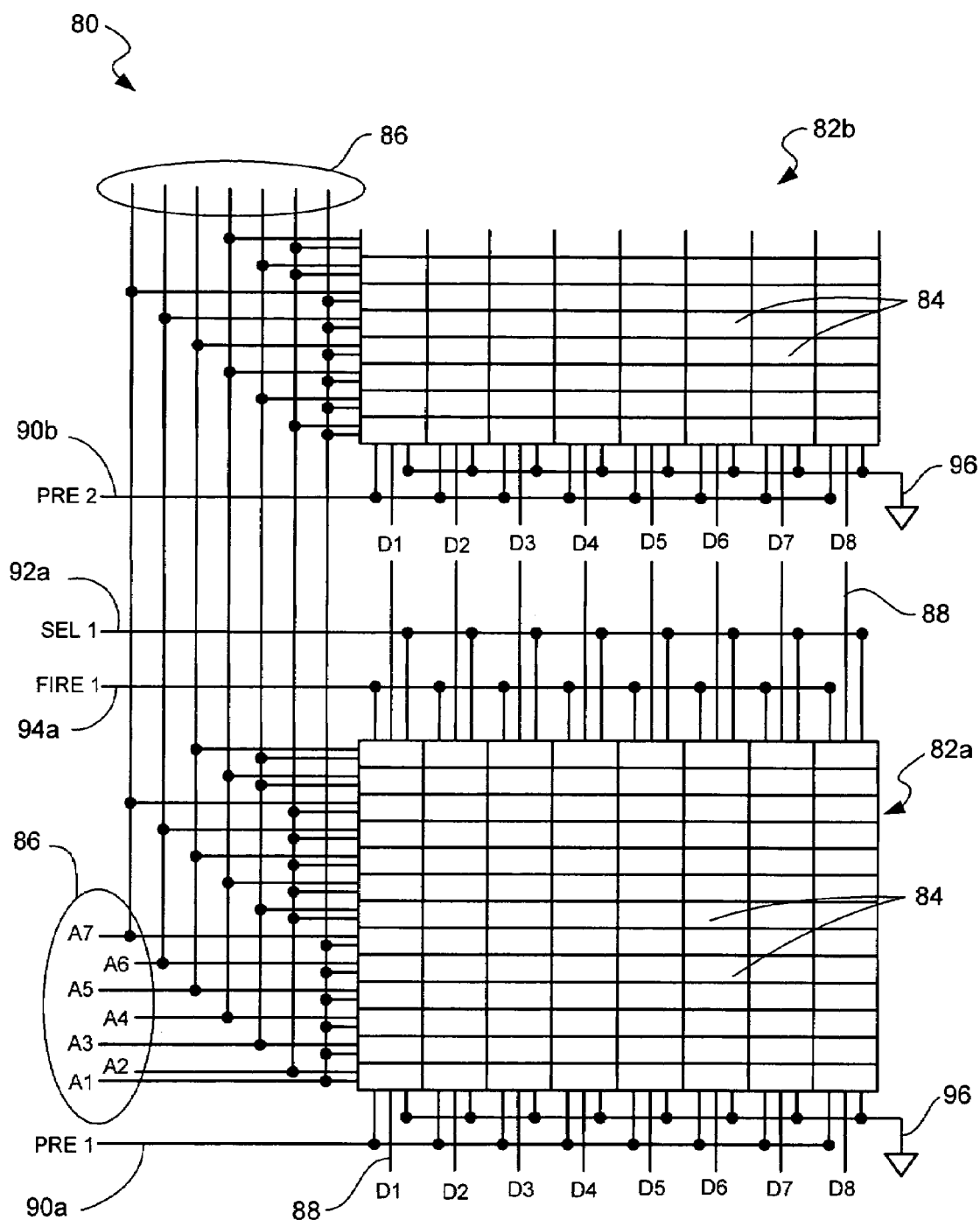
FIG. 3 is a schematic diagram illustrating one embodiment of an ink jet printhead firing cell array.

Shown in FIG. 3 is a schematic diagram of a portion of one embodiment of an inkjet printhead firing cell circuit 80. The firing cell circuit includes a plurality of fire groups 82 (e.g. six fire groups), each fire group comprising an array of pre-charged firing cells 84. A first fire group 82a and a portion of a second fire group 82b are shown in FIG. 3. The pre-charged firing cells in each fire group are schematically arranged into 13 rows and eight columns. The number of pre-charged firing cells and their layout may vary as desired.

The eight columns of pre-charged firing cells 84 are electrically coupled to eight data lines 88, labeled D1-D8. Each of the firing cells in each column of pre-charged firing cells is electrically coupled to one of the data lines, and these data lines extend to the corresponding columns of pre-charged firing cells in fire group 82b and subsequent fire groups (not shown).

The rows of pre-charged firing cells 84 are electrically coupled to address lines 86, labeled A1-A7, that receive address signals. Each pre-charged firing cell in a row of pre-charged firing cells, referred to herein as a row subgroup or subgroup, is electrically coupled to the same pair of the address lines, this pair being unique for each row subgroup. The array of firing cells shown in the fire group 82 includes 13 row subgroups, but it will be apparent that the array can include any suitable number of subgroups. The address lines also extend to connect with row subgroups of fire group 82b and subsequent fire groups (not shown).

The pre-charge line 90a (labeled PRE 1) receives a pre-charge signal, and provides the pre-charge signal to all of the pre-charged firing cells 84 in the first fire group 82a. Additional fire groups each have a separate pre-charge line, such as pre-charge line 90b (labeled PRE2) for fire group 82b.

A select line 92a (labeled SEL 1) receives a select signal and provides this select signal to all firing cells 84 in a corresponding fire group 82 and a fire line 94a (labeled FIRE 1) provides a fire signal to all pre-charged firing cells in the associated fire group. The fire line is electrically coupled to the firing resistors (52 in FIG. 2) of all pre-charged firing cells 84 in one fire group. Additional fire groups each have their own separate select and fire lines.

Additionally, all pre-charged firing cells 84 in the array 80 are electrically coupled to a reference line 96 that is tied to a reference voltage, such as ground. Given this structure, the pre-charged firing cells in a row subgroup of pre-charged firing cells are electrically coupled to the same address lines 86, pre-charge line 90, select line 92, fire line 94, and ground line 96.

The firing cells 84 cause the individual firing resistors (52 in FIG. 2) of the ink nozzles to selectively operate, so as to eject ink in the desired pattern. The fire groups are first precharged through the respective PRE lines 90. Address signals are provided on the address lines 86 to address one row subgroup in each of the fire groups 82, including one row subgroup in the pre-charged fire group. Data signals are provided on data lines 88 to provide data to all fire groups, including the addressed row subgroup in the pre-charged fire group. Next, a select signal is provided on the select line 92 of the pre-charged fire group to select the pre-charged fire group. The select signal defines a discharge time interval for discharging the node capacitance on each drive switch (not shown) in a pre-charged firing cell that is either not in the addressed row subgroup in the selected fire group or addressed in the selected fire group and receiving a high level data signal. The node capacitance does not discharge in pre-charged firing cells that are addressed in the selected fire group and receiving a low-level data signal. A high voltage level on the node capacitance turns the drive switch on (conducting).

After drive switches in the selected fire group 82 are set to conduct or not conduct, an energy pulse or voltage pulse is provided on the fire line 94 of the selected fire group. Pre-charged firing cells 84 that have conducting drive switches conduct current through the firing resistor (52 in FIG. 2) to heat ink and eject ink from the corresponding drop generator (60 in FIG. 2). In operation, the plurality of fire groups 82 can be selected to fire in succession, or other sequences, and non-sequential selections may also be utilized. The address signals provided on the address lines 86 can be set to one row subgroup address during each cycle through the fire groups, and thereby cycle through the 13 row subgroup addresses in each fire group before repeating a row subgroup address. After the last row subgroup, address signals select the first row subgroup to begin the address cycle over again.

With fire groups 82 operated in succession, the select signal for one fire group is used as the pre-charge signal for the next fire group. The pre-charge signal for one fire group precedes the select signal and fire signal for the one fire group. After the pre-charge signal, data signals are multiplexed in time and stored in the addressed row subgroup of the one fire group by the select signal. The select signal for the selected fire group is also the pre-charge signal for the next fire group. After the select signal for the selected fire group is complete, the select signal for the next fire group is provided. Pre-charged firing cells 84 in the selected subgroup fire or heat ink based on the stored data signal as the fire signal, including an energy pulse, is provided to the selected fire group.

Figure 4:
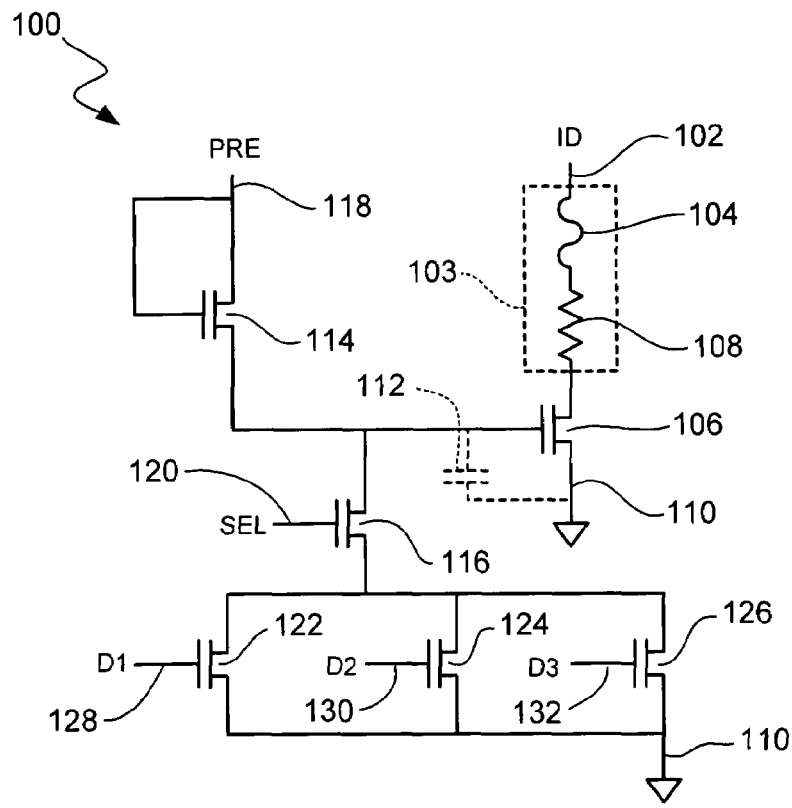
FIG. 4 is a schematic diagram of one embodiment of an identification cell in one embodiment of a printhead die.

As noted above, it can be desirable to provide a greater amount of identification information in the printhead circuit, without adding further interconnections to the flex tab circuit or increasing the size of the die to provide such identification information. Accordingly, identification cells have been developed that can be included in the printhead circuitry, such as that shown in FIG. 3. Provided in FIG. 4 is a schematic diagram of one embodiment of an identification cell 100 that can be fabricated in the circuitry of one embodiment of a printhead die (40 in FIGS. 1 & 2). The printhead die can include a plurality of such identification cells electrically coupled to one identification line 102 which receives an identification signal and provides the identification signal to the identification cells.

The identification cell 100 includes a memory element 103. The memory element 103 stores one bit of information. In one embodiment, depicted in FIG. 4, the memory element 103 comprises a fuse, represented by fuse element 104 and fuse resistance 108. The identification cell 100 includes a drive transistor or drive switch 106 electrically coupled to the memory element 103. The drive switch can be a FET (Field Effect Transistor) having a drain-source path that is electrically coupled at one end to one terminal of the memory element 103 and at the other end to a reference 110, such as ground. The other terminal of the memory element 103 is electrically coupled to the identification line 102. The identification line 102 receives an identification signal ID and provides the identification signal ID to the memory element 103. The identification signal ID, including the program signal and the read signal, can be conducted through the memory element 103, if the drive switch 106 is turned on (conducting). This allows for only specific identification cells on a single identification line to respond to read and programming signals on the identification line, while other identification cells on the same identification line do not respond to the read and programming signals.

The gate of the drive switch 106 forms a storage node capacitance 112, which functions as a memory to store charge pursuant to the sequential activation of the pre-charge transistor 114 and the select transistor 116. The drain-source path and gate of the pre-charge transistor 114 are electrically coupled to the pre-charge line 118 that receives a pre-charge signal PRE. The pre-charge line 118 can be electrically connected to the pre-charge line 90 in FIG. 3.

The gate of the drive switch 106 is a control input that is electrically coupled to the drain-source path of the pre-charge transistor 114 and the drain-source path of the select transistor 116. The gate of the select transistor 116 is electrically coupled to the select line 120 that receives a select signal SEL. The select transistor 116 can be electrically connected to the select line (92 in FIG. 3). The storage node capacitance 112 is shown in dashed lines, as it is part of the drive switch 106. Alternatively, a capacitor separate from the drive switch can be used to store charge.

The identification cell also includes a first transistor 122, a second transistor 124 and a third transistor 126 having drain-source paths that are electrically coupled in parallel. The parallel combination of these three transistors is electrically coupled between the drain-source path of the select transistor 116 and the reference 110. The serial circuit including the select transistor 116 coupled to the parallel combination of the first, second and third transistors 122, 124, 162, respectively is electrically coupled across the node capacitance 112 of the drive switch 106.

The gates of the first, second, and third transistors, 122, 124 and 126, are electrically coupled to three of the data lines of the associated fire group (82 in FIG. 3). The three data lines so connected can be any unique group of three of the eight data lines D1-D8 associated with the corresponding fire group. As shown in FIG. 4, the data lines can be those labeled D1-D3 in the fire group 82 in FIG. 3.

The pre-charge signal can be the pre-charge signal provided on pre-charge line 90a (labeled PRE 1) to the fire group 82, and the select signal can be the select signal provided on select line 92a (labeled SEL 1) to the fire group 82 in FIG. 3. To program the memory element 103, the identification cell 100 receives enabling signaling, including the pre-charge signal PRE, select signal SEL and data signals D1-D3 to turn on the drive switch 106. The identification line 102 provides the program signal in the identification signal to the memory element 103. The program signal provides a relatively high voltage (e.g. 16 volts) through the memory element 103 to the conducting drive switch 106 and reference 110. This high voltage changes the state of the memory element 103 from a low resistive state to a high resistive state by burning out the fuse 104.

To read the state of the memory element 103, the identification cell 100 receives enabling signaling, including the pre-charge signal, select signal and data signals D1-D3 to turn on the drive switch 106. The identification line 102 provides the read signal in the identification signal to the memory element. The read signal provides a current through the memory element 103 to the conducting drive switch 106 and reference 110. The voltage on the identification line can be detected to determine the resistive state of the memory element. In one embodiment, the memory element is determined to be in the high resistive state if the resistance is greater than about 1000 ohms (i.e. the fuse is burned out) and in the low resistive state if the resistance is less than about 400 ohms (i.e. the fuse is intact).

Using the configuration of FIG. 4, each identification cell 100 can be individually enabled, and thereby can be programmed on an individual basis. Also, since the identification cells can be read individually, the combinations utilized to store data are greatly increased. For example, a single identification cell can be utilized in multiple combinations that each represents different information.

With three of eight data signals D1-D8 selecting each identification cell 100 in a plurality of identification cells, up to fifty six different identification cells can be selected by combinations of three of the eight data signals. Thus, with one pre-charge line, one select line, eight data lines, and one identification line the circuit can control fifty six memory elements, or about 5.1 memory elements per control line. Alternatively, each memory element can be configured to respond to any suitable number of data signals, such as two or four or more data signals.

It should be noted that while FIG. 4 discloses utilizing a single identification line 102 that is coupled to each of the identification cells 100, more than one identification line may be utilized, thus allowing a larger number of identification cells. Also, the number of identification cells that are provided may be more or less than 56 depending on factors such as the size of the die, the operating parameters of the fluid ejection device, or other considerations. Also, the number of identification cells that are encoded with information may be less than the total number of identification cells on the die.

While the identification cell configuration described above can be used in a variety of ways to store identification information on the printhead, fuses present some drawbacks noted earlier. The inventor has recognized that electronically programmable read-only memory, or EPROM, can be desirable to eliminate fuses in NMOS circuits, such as in ink jet printheads and other applications. EPROM cells do not include fuses, and provide a number of advantages over NMOS memory elements.

Figure 5:
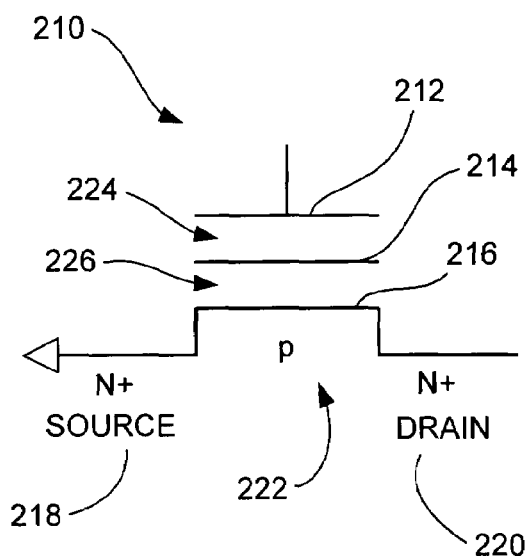
FIG. 5 is a schematic diagram of a typical EPROM transistor.

Shown in FIG. 5 is a schematic diagram of a typical EPROM cell 210. An EPROM cell generally includes an input gate 212 (also called a control gate), a floating gate 214, and a semiconductor substrate 216 that includes a source 218 and a drain 220. As shown in FIG. 5, the substrate is provided with N+ doped regions adjacent to the source and drain, respectively, and a p doped region 222 therebetween. The control gate 212 and floating gate 214 are capacitively coupled together, with a dielectric material 224 between them, such that the control gate voltage is coupled to the floating gate. Another layer of dielectric material 226 is also disposed between the floating gate 214 and the semiconductor substrate 216.

A high voltage bias on the drain 220 generates energetic "hot" electrons. A positive voltage bias between the control gate 212 and the drain 220 pulls some of these hot electrons onto the floating gate 214. As electrons are pulled onto the floating gate 214, the threshold voltage of the cell 210, that is, the voltage required to cause the gate to conduct current, increases. If sufficient electrons are pulled onto the floating gate, those electrons will block current flow such that the threshold voltage will eventually increase to a level above a desired threshold voltage (e.g. the operating voltage of the circuit). This will cause the cell to block current at that voltage level, which changes the operating state of the cell from a 1 to a zero. After programming of the cell, a cell sensor (not shown) is used during normal operation to detect the state of the EPROM cell.

Figure 6:
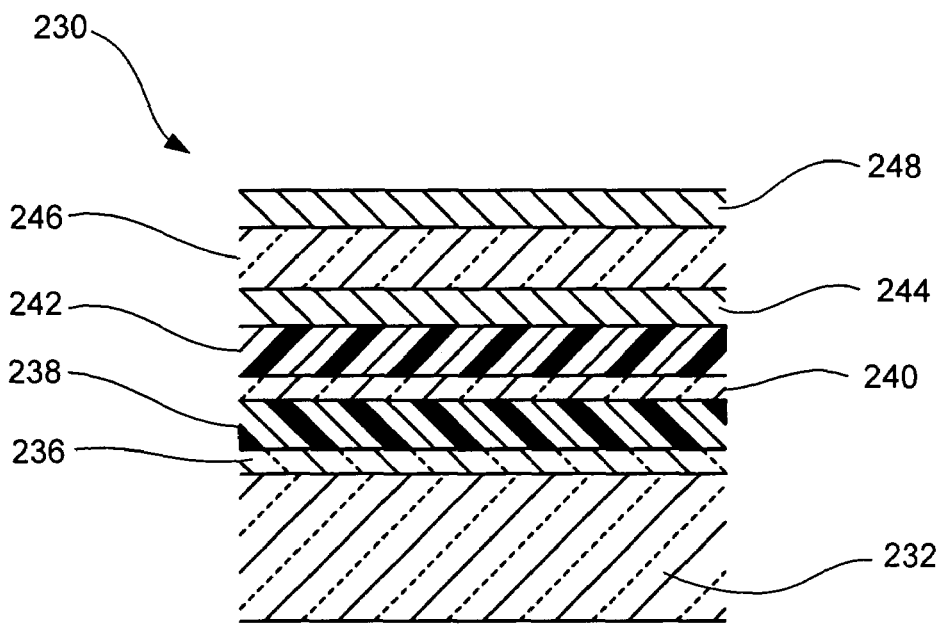
FIG. 6 is a cross-sectional view showing the circuitry layers in a typical EPROM chip.

Because EPROM cells include two gates at each memory element location, these chips require more layers than a PROM or NMOS chip as is typically used in an inkjet printhead circuit. Shown in FIG. 6 is a cross-sectional view of the layers in a typical EPROM chip 230. Disposed atop the semiconducting silicon substrate 232 is a gate oxide 236. Disposed atop the gate oxide layer is a layer of polysilicon material 238, in which the floating gate (214 in FIG. 5) is formed. When properly doped, this polysilicon material functions as a conductor. The gate oxide layer 236 functions as a dielectric layer (226 in FIG. 5) between the floating gate and the semiconductor substrate.

Disposed atop the floating gate layer is another layer 240 of gate oxide material, which provides another dielectric layer, atop which is another layer of polysilicon 242, in which the control gate (212 in FIG. 5) is formed. Disposed atop the polysilicon layer 242 are one or more metal layers 244, 248, separated by another dielectric layer 246. The metal layers provide row and column lines for the EPROM circuit, and also make the various electrical connections between the control gate, the drain, and other components of the circuit.

These circuit layers in a typical EPROM circuit are in contrast to the layers found in a typical inkjet printhead circuit. A cross-sectional view of the layers in an inkjet control chip 250, such as that providing the inkjet firing control circuit shown in FIG. 3, is given in FIG. 7. This chip includes a semiconductor substrate 252, atop which is an oxide layer 254 (such as silicon dioxide, $SiO_2$), followed by a polysilicon layer 256, a dielectric layer 258, then a Metal 1 layer 260 and Metal 2 layer 264, these metal layers being separated by a dielectric layer 262.

The two metal layers 260, 264 provide the conductors for the address lines, data lines, pre-charge, select, and fire lines, and other circuit connections. It will be apparent that this layer configuration lacks an additional polysilicon layer and gate dielectric that would be needed for creation of a standard EPROM cell. Prior attempts to implement EPROM's in this type of circuit have focused on adding additional process steps to add an extra floating gate and gate dielectric. Another option is to add a separate EPROM chip. Both of these options add complexity and cost Advantageously, the inventor has developed a gate-coupled structure and method for providing EPROM functionality using only the layers in this PROM inkjet control chip 250 of FIG. 7, without adding process layers and cost. Shown in FIG. 8 is a schematic diagram of a gate-coupled EPROM memory element 270 that can be created using the existing layers of the inkjet control chip 250 shown in FIG. 7. The gate-coupled EPROM memory element comprises two transistors having their floating gates tied together. The first transistor 272 is a control transistor, and the second transistor is the EPROM transistor 274. The control transistor 272 includes two control connections or control terminals, the first control terminal being labeled Control1, and the second control terminal being labeled Control2.

The floating gate 280 of the control transistor 272 is electrically coupled to the floating gate 282 of the EPROM transistor 274 by an electrical interconnection 281. The EPROM transistor includes a drain 284 and source 286, which can be connected to ground. The voltage appearing at floating gate 280 is dependent upon the overlap capacitance of the source 278 and drain 276 of the control transistor 272, and whether the gate of the control transistor 272 is on. The overlap and gate capacitance couple the voltage at first control terminal Control1 and second control terminal Control2 to the floating gate 280. The capacitance needs to be large enough to provide adequate coupling voltage to the floating gate 280. A standard EPROM uses the capacitance in the dielectric layer between the control gate and the floating gate to couple the voltage to the floating gate. By contrast, in the gate-coupled device disclosed herein and shown in FIG. 8, the gate to drain overlap capacitance between first control terminal Control1 couples the voltage at second control terminal Control1 to the floating gate 280. The gate to source overlap capacitance at second control terminal Control2 couples the voltage at second control terminal Control2 to the floating gate 280. The goal is to find some capacitance structure to couple to the floating gate 280. In this configuration shown in FIG. 8, the gate oxide layer (254 in FIG. 7) that provides the gate capacitance of a standard transistor is used in a reverse direction to provide this capacitance structure.

Figure 7:
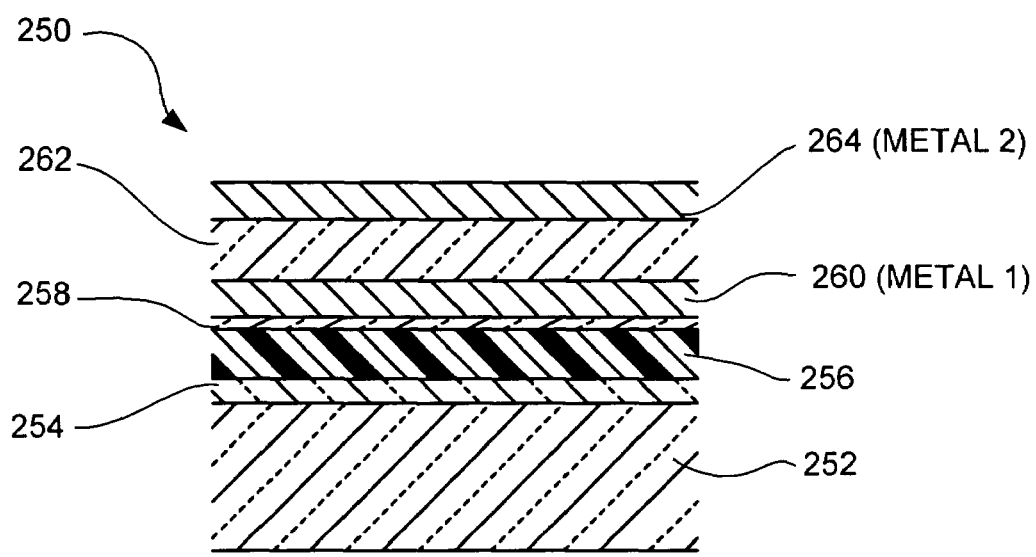
FIG. 7 is a cross-sectional view showing the layers in one embodiment of an ink jet printhead die providing the circuitry shown in FIG. 3.
Figure 8:
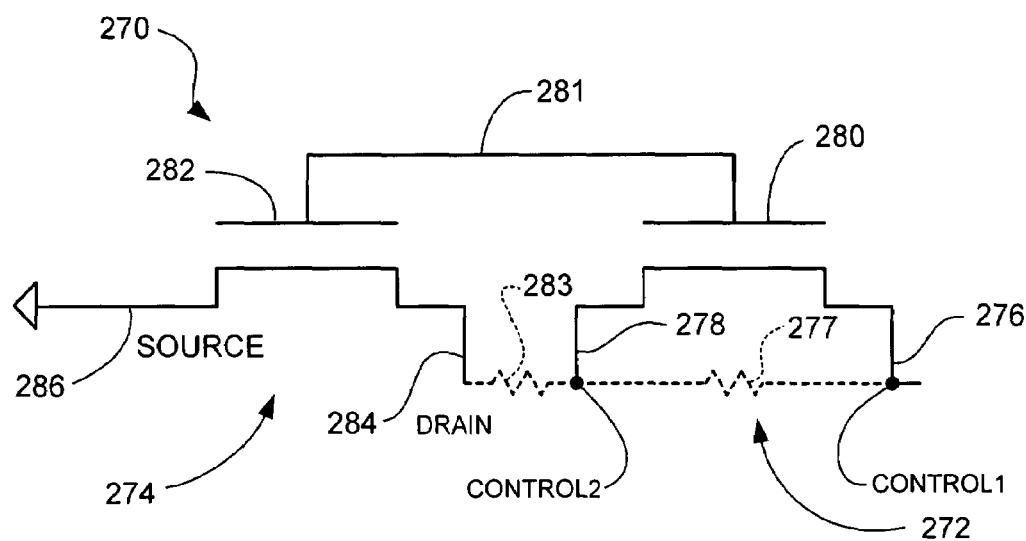
FIG. 8 is a schematic diagram of one embodiment of a gate-coupled EPROM cell that can be adapted for use as an identification bit in the printhead circuitry of FIG. 4.

This gate-coupled structure is fully compatible with the printhead layer structure of inkjet control chip 250 shown in FIG. 7, and only requires modification of the geometric layout of the various circuit layers. The floating gates 280, 282 of the control and EPROM transistors 272 and 274, respectively, as well as the coupling connection between them, can be fabricated in the polysilicon layer 256 of the printhead circuit. Further, these floating gates 280, 282, which are formed in the polysilicon layer 256, can be electrically interconnected by the electrical interconnection 281, which is formed from the Metal1 layer 260. The gate/drain coupling is from the n+ drain region of the substrate 252 to the gate, through the gate oxide layer 254. The Metal1 layer 260 can be configured to connect the source 278 of the control transistor 272 to the drain 284 of the EPROM transistor 274. One advantageous feature of this configuration is that there is both source and drain coupling to the floating gate 280. This provides additional capacitive coupling from the control terminals, first control terminal Control1 and second control terminal Control2, to the floating gate 280. In general, the more capacitive coupling the better.

Referring again to FIG. 8, the drain 276 and the source 278 of the control transistor 272 can be tied together by the electrical interconnection 281, or second control terminal Control2 can be tied to the drain 284 of the EPROM transistor 274. For some implementations, first control terminal Control1 and second control terminal Control2 and Drain 284 of EPROM transistor 274 can be tied to separate voltages to get more efficient coupling. With second control terminal Control2 and Drain 284 tied together, the voltage on Drain 284 can limit the voltage on second control terminal Control2 and the amount of voltage coupled to the floating gate 280.

In one embodiment, a space efficient layout can be obtained by tying the Drain 284 of the EPROM transistor 274 to the source 278 of the control transistor 272. If a resistor is not needed to limit the drain current (e.g., limiting overheating by controlling pulse width instead, or by relying on the resistance of the Select transistors in arrays), first control terminal Control1, second control terminal Control2, and Drain 284 can all be tied together. This configuration provides a high level of coupling in a small area, but also has higher sensitivity to excess drain current and overheating.

Alternatively, to limit drain current, the drain 284 of the EPROM transistor 274 can be tied directly to second control terminal Control2 at the source 278 of the control transistor 272, while a resistor 277 (shown in dashed lines in FIG. 8) is electrically coupled between first control terminal Control1 and second control terminal Control2. This configuration can be more robust with respect to drain current problems, although the common voltage presented thereby at the second control terminal Control2 and at drain 284 of EPROM transistor 274 will be lowered and will provide less voltage to the floating gate 280.

Another approach is to couple directly together the source 278 and the drain 276 of the control transistor 272, while a resistor 283 (shown in dashed lines in FIG. 8) is electrically coupled between the Drain 284 of the EPROM transistor 274 and either the source 278 or the drain 276 of control transistor 272. The resistor 283 would limit current into the Drain 284, but the voltage at the first control terminal Control1 and the second control terminal Control2 would still be at maximum voltage for greater voltage coupling to the floating gate 280.

Programming of this gate-coupled EPROM cell 270, like typical EPROM cells, is done by applying a voltage pulse to the source 276 and gate, 278 of the control transistor 272. This is done in order to provide a quantity of hot electrons to the floating gate 280. It is desirable that the voltage on the Drain 284 be close to the breakdown voltage of the circuit. The breakdown voltage is the voltage at which the EPROM transistor 274 begins to conduct with the gate below threshold voltage (gate at zero volts). In one embodiment, the inventor has programmed the EPROM circuit at a voltage of about 16±1 V where the circuit has a breakdown voltage of 15 Volts As noted above, drain 278 can be tied to the Drain 284 with a resistor 283 (having a resistance of, e.g., 100 ohm) in order to limit the breakdown voltage. Additionally, the physical size of the channel (gate) length—that is, the length of the channel under the gates of the EPROM transistor 274—can be manipulated to modify the breakdown voltage. For example, a narrower gate length will lower the breakdown voltage. In one embodiment, the inventor has used a gate length of from 3.0 µm to 3.5 µm, instead of 4 µm for this purpose.

The time required for programming is a function of the floating gate voltage, the quantity of hot electrons drawn to the floating gate, the threshold voltage change desired, the total gate structure capacitance, and the thickness of the gate oxide (layer 254 in FIG. 7). The gate oxide thickness determines the percentage of energetic hot electrons that are able to reach the floating gate 280. In one embodiment, the floating gate voltage is in the range of 5 volts to 12 volts, though other voltage ranges can be used. The floating gate voltage depends upon the voltage on the drain 276 and source, 278 of the control transistor 272, and the coupling ratio of the silicon substrate and polysilicon layers (252, 256, respectively, in FIG. 7). While the desired hot electrons will be provided with any gate oxide thickness, the thickness of the gate oxide will sometimes be fixed for a given chip configuration. For example, in one embodiment of a printhead control chip, the thickness of the gate oxide is fixed at about 700 Å.

The quantity of hot electrons provided during programming is higher when programming is done at close to the breakdown voltage, and with higher current. In one embodiment, the inventor has programmed with a 25 mA current, though other currents can also be used. The inventor has also contemplated a 20 mA programming current, for example, and other currents can also be used. A range for the threshold voltage that the inventor has used is from 3 volts to 7 volts, but other threshold voltage ranges can also be used. Under the above parameters, the inventor has found that a 10 millisecond programming time can be used. However, different programming times can also be used, particularly if the various parameters mentioned above are varied. For example, the programming time can range from less than 100 µs to as much as several seconds (e.g. 4 seconds).

Reading of the EPROM cells is done by detecting the threshold voltage across the gate-coupled EPROM cell 270 using a cell sensor (not shown) elsewhere in the circuit. Detecting the threshold voltage can be done either by setting the gate/drain voltage and measuring the corresponding current, or by setting the current and measuring the voltage. The inventor has found that the on resistance ($R_{on}$) of the EPROM cell changes by a factor of about 2 before and after programming.

The inventor has built and tested this type of EPROM cell in a laboratory setting. In the test setup, a modified cell was built to monitor the floating gate voltage. A voltage pulse was applied to the gate and drain to program the EPROM cell to a desired threshold voltage. To test the cell to sense the gate voltage, the gate of a second sense transistor (not shown) was connected to the floating gate of the EPROM cell. This caused the gate voltage of the sense transistor to be the same as the floating gate voltage. The on resistance ($R_{on}$) of the second transistor is proportional to the gate voltage. By monitoring the on resistance of the second transistor, the floating gate voltage could be determined.

Figure 9:
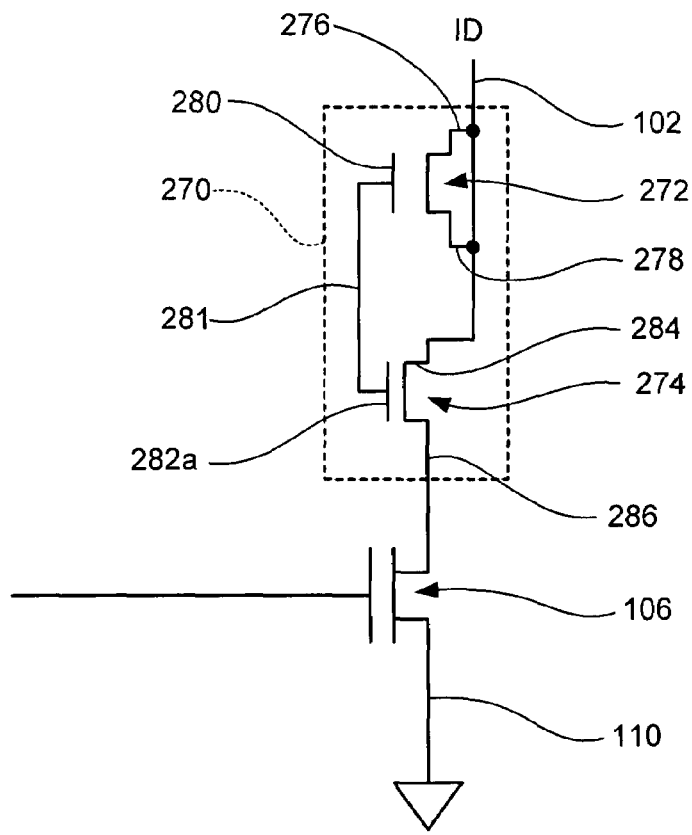
FIG. 9 is a schematic diagram of one embodiment of an identification cell having a gate-coupled EPROM identification bit.

The gate-coupled EPROM cell shown in FIG. 8 can be incorporated into circuitry in which each EPROM identification cell is associated with a separate control circuit, like that of FIG. 4, or the gate-coupled memory elements can be incorporated into an array of identification cells that share control circuitry. Shown in FIG. 9 is one embodiment of a gate-coupled EPROM cell associated with individual control circuitry. This figure shows a portion of the circuitry of the identification cell of FIG. 4, with the gate-coupled EPROM cell 270 inserted in place of the memory element (103 in FIG. 4). Such a configuration will provide one control line per cell, with the operation of each EPROM cell being controlled by an individual control transistor. This sort of configuration has a larger physical size than the shared-circuitry arrangement, but is similar to some control schemes currently used with fuses.

As shown in FIG. 9, the identification line 102 is connected to the drain 276 and to the source 276 of the control transistor 272, as well as to the drain of the EPROM transistor 274. In control transistor 272, overlap and gate capacitance couples the voltage at the drain 276 and the source 278 to the floating gate 280. The source 286 of the EPROM transistor is coupled to the drain of the drive switch 106, which has its source coupled to ground 110. The floating gate 280 of control transistor 272 is electrically coupled by the electrical interconnection 281 to a floating gate 282a of EPROM transistor 274 that is narrower than the floating gate 282 of the EPROM transistor 274 in FIG. 8. The narrower gate 282a on the EPROM transistor 274 in FIG. 9 causes the EPROM transistor 274 in FIG. 9 to have a lower breakdown voltage than the breakdown voltage of the EPROM transistor 274 in FIG. 8. This allows the gate-coupled EPROM cell 270 to obtain an adequate quantity of hot electrons at the EPROM transistor 272 without exceeding the breakdown voltages of other transistors on the circuit. As discussed above with respect to FIG. 8, a resistor 283 (e.g. about 100 ohms) could be added between the drain 284 of the EPROM transistor 274 and the source 278 of the control transistor 272, or a resistor 277 can be placed between the source 278 of the control transistor 272 and the drain 276 of the control transistor 272. The method chosen would depend upon layout decisions and technique used to control drain current.

Referring back to FIG. 9, when the transistor 106 is turned on, the source of the EPROM transistor 274 is essentially at ground, and the EPROM cell functions as described for the cell in FIG. 8. A voltage on the ID line 102 couples through the gate oxide of the control transistor 272 to the floating gate (280/282 in FIG. 8). A high voltage (16V) will program the EPROM. A lower voltage will be used to read by detecting the threshold voltage or the on resistance. If the transistor 106 is off, any voltage applied to the ID line will not have a path to ground, and the EPROM cell will not be affected.

Figure 10:
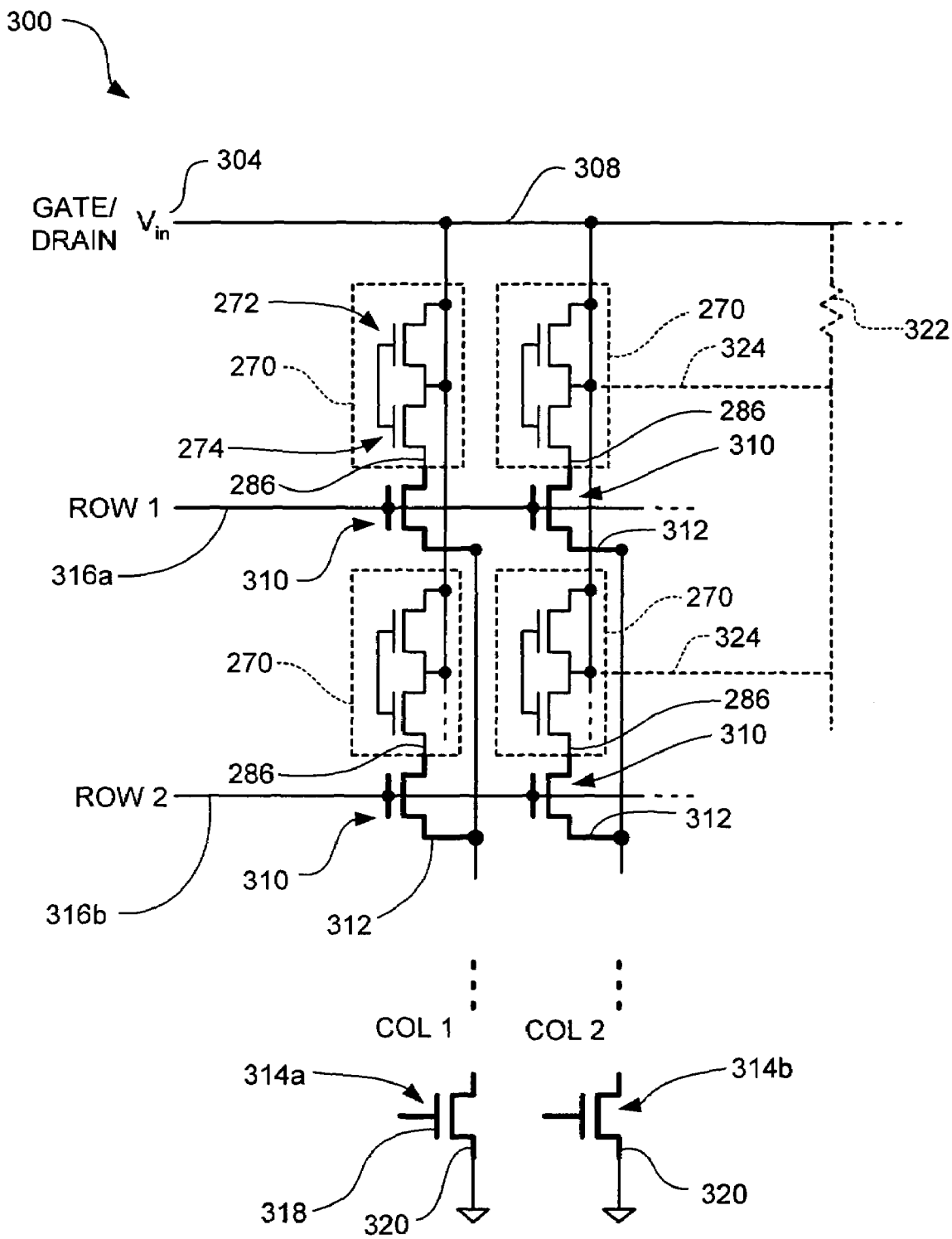
FIG. 10 is a schematic diagram of an array of gate-coupled EPROM cells for a printhead circuit.

Shown in FIG. 10 is a partial schematic diagram of an EPROM array 300 that can be produced using the gate-coupled EPROM cell disclosed herein. In this configuration an array of gate-coupled EPROM memory elements share control circuitry. In this array, a plurality of gate-coupled EPROM cells 270 are arranged in rows and columns. The input line of each gate-coupled EPROM cell is tied to the input voltage $V_{in}$ (designated at 304) through input line 308. The source line 286 of each EPROM transistor 274 is tied to the drain of a row transistor 310. The row transistors are tied through their sources 312 to the drains of column transistors 314. If desired, a drain current limiting resistor (not shown) can be added to the EPROM cell, as described above with respect to FIG. 9. Rather than an individual resistor for each gate-coupled cell, a single resistor 322 (shown in dashed lines in FIG. 10) could be provided to feed all of the transistors in parallel. This resistor can be connected between the voltage Vin and the drain of the EPROM transistor (284 in FIG. 8), with a single line from Vin to the resistor, and separate lines 324 (shown in dashed lines in FIG. 10) extending from the resistor to the drains of each of the EPROM transistors in the array. The connection between the source and drain of the EPROM control transistor 272 would then be removed, and all of the control transistor-drain connections of the EPROM cell 270 would be tied directly to the input line 308.

The row lines, labeled 316a for Row 1, 316b for Row 2, etc., connect to the gates of all row select transistors 310 in a given row. The sources 312 of all row transistors in a given column are connected to the drain of the column transistor 314 for that column. The gates 318 of each column transistor are connected to a voltage source (not shown) through column lines (not shown). The sources 320 of the column transistors are connected to a common voltage, such as ground. The column transistors are labeled 314a for Column 1, 314b for Column 2, and so on.

The row transistors 310 and column transistors 314 allow selection of the specific gate-coupled EPROM cells, both for programming and reading. The column transistors are normal transistors, and the interconnects to these transistors can be fabricated in the Metal 1 layer (260 in FIG. 7). Some advantages of this circuit are that it is more compact than implementation of identification cells with separate control circuitry, and it doesn't require the Metal2 layer and its associated layout rules. Additionally, the size of the gate-coupled EPROM array 300 is not limited by the configuration of the printhead firing cell control circuitry (80 in FIG. 3). This array can be as large or as small as desired, regardless of the number of data lines associated with the firing cell control circuit.

To program a cell 270 of the array 300, the cell is selected by applying a voltage to one row line (e.g. 316a) and one column line (e.g. to the gate of column transistor 314a), and then a pulse of relatively high voltage $V_{in}$ (e.g. 16V) is applied. To sense the condition of the cell, a lower input voltage $V_{in}$ pulse (e.g. 5V) is applied in the same way, and the current is monitored. In this array, there is no high voltage across the drain to the source of the EPROM transistor except when programming. Advantageously, there are no drain to gate voltage coupling issues because the drain and gate of the EPROM transistors switch together. In addition, gate to drain coupling is actually advantageous because it increases the voltage coupling to the gate.

The inventor has found that the size of the row select transistors 316 is significant because they must handle the programming current, such as 20 mA, 25 mA, or higher. For this purpose, the inventor has used row select transistors having a width of 150 μm. It will be apparent that smaller sizes can be used for lower programming current, and larger sizes will be needed for higher current.

In operation, a row signal turns on all row control transistors 316 in that row. A column signal turns on a selected column control transistor 314. An input voltage $V_{in}$ is then applied, and only the cell 270 with both its row and column transistor turned on will have the full voltage across it. All other cells will have the source of the EPROM transistor floating. That is, the source of the EPROM transistor will not be driven to any fixed voltage, but will just float to the voltages on the other terminals. There will be no voltage across the EPROM transistor.

An EPROM array can be configured in the manner described above for use in providing pen ID bits in an inkjet printhead. In this configuration, the row and column signals can be supplied by the shift register of the pen control circuit. That is, rather than drive the row and column lines individually, the respective values can be shifted into a shift register, and driven from the shift register outputs. The shift register addresses the row and column selects of the 2×10 array. It will be apparent to those skilled in the art of semiconductor design that the geometric configuration of the circuitry can be configured in a variety of ways.

The inventor has built and programmed a 4-bit array based on the above design. After programming, the EPROM cells have held their charge for over a year.

The reliability and longevity of the gate-coupled EPROM cell described herein depends upon a number of factors. Because the structure is different than the typical EPROM cell configuration, some aspects of the resultant design affect its robustness. For example, the larger size of the floating gate (280 in FIG. 8) can allow more area for leakage current. Additionally, the gate oxide (254 in FIG. 7) is not processed for absolute minimum leakage current.

Additionally, the flatness of the layers can affect their performance. Slight undulations in layer surfaces and variations in the thickness of the different layers can cause charge concentrations and leakage between the layers. In a pen control circuit configured with the layers of the PROM chip shown in FIG. 7, for example, the thickness and flatness of the polysilicon layer 256 and adjacent dielectric layer 254 are not as critical for operation of the PROM circuit. This factor affects the level of quality control applied to formation of these layers. However, in an EPROM circuit, these factors have a greater effect.

At the same time, there are other factors that affect fuses that do not affect EPROMS, or that do not affect them in the same way or to the same extent. As noted above, fuses have a number of drawbacks that are frequently bothersome. It is believed that EPROMs will ultimately be more reliable than fuses in the application disclosed herein. Where the possible limitations of the gate-coupled EPROM cell disclosed herein can be tolerated, this configuration can be useful without the need to increase quality control. This is true of inkjet pens. The design life for an inkjet pen is usually about 18 months, primarily because inkjet cartridges are usually sold soon after manufacture, and because the pen then gets used up. Consequently, if the EPROM cells can reliably hold their charge for that time period, there is little likelihood that the device will not work as intended. However, this same structure can be effectively used in other applications where greater reliability is desired by exerting greater control over the flatness and thickness of the layers.

The gate-coupled EPROM structure disclosed herein can replace fuses in inkjet pen control circuits without adding process layers and cost. This configuration provides cells that are larger than traditional EPROM cells, but smaller than fuses.

The gate-coupled identification cells can be used to store a wide variety of identification information indicating features of or other information about the printhead die. For example, a printer employing a printhead having EPROM identification cells can use the identification information for a wide variety of purposes to optimize printing quality or perform other functions. For example, selected identification cells can store identification information about the printhead die, or about the inkjet cartridge or pen in which the printhead die is inserted, such as information indicating an out of ink detection level.

The identification cells can also store identification information indicating a thermal sense resistance (TSR) value to determine the temperature of the printhead. Selected identification cells can store identification information indicating a printhead uniqueness number to identify and properly respond to the printhead. Identification cells can be used to store identification information indicating an ink drop weight for a printhead. A printer can account for the drop weight values stored in selected identification cells and the out of ink detection level information stored in other selected identification cells to determine actual out of ink detection levels.

The printer can also use identification information for marketing purposes, such as regional marketing and original equipment manufacturer (OEM) marketing. For example, selected identification cells store identification information indicating a marketing region for the fluid ejection device. In one embodiment, selected identification cells can store identification information indicating the seller of an OEM fluid ejection device. Selected identification cells can also store identification indicating whether an OEM printer is unlocked. For example, the OEM printer can respond to the OEM unlocked information to unlock an OEM printer, such that the OEM printer can accept OEM printheads sold by a given company or group of companies and printheads sold by companies other than the given company or group of companies, such as the actual original manufacturer company.

Selected identification cells store identification information indicating the product type and product revision of a fluid ejection device. The product type and product revision can be used by a printer to ascertain physical characteristics about a printhead. Product revision physical characteristics, such as spacing between nozzle columns, that may change in future products can also be stored in selected identification cells of a printhead. In this embodiment, the product revision physical characteristic information can be used by the printer to adjust for the physical characteristic changes between product revisions.

Gate-coupled EPROM cells configured this way can also be used for many other purposes in addition to those noted above. Because the charge on the floating gate of the EPROM transistor (282 in FIG. 8) is cumulative, this configuration can be used to store cumulative quantities. For example, in an inkjet printhead, the gate-coupled EPROM cells can be successively reprogrammed to track the number of pages printed out, or for other purposes. Since programming of EPROM cells modifies the threshold voltage of the EPROM cell 270, successive programming of these cells can be used to control analog circuits, such as to create a variable time delay. Other applications are also possible.

It is to be understood that the above-referenced arrangements are illustrative of the application of the principles of the present invention. It will be apparent to those of ordinary skill in the art that numerous modifications can be made without departing from the principles and concepts of the invention as set forth in the claims.

What is claimed is:

1. An EPROM cell in a printhead control circuit for an inkjet printer, the control circuit having a semiconductor substrate, one and only one polysilicon layer disposed above the semiconductor substrate, and a conductive layer disposed above the polysilicon layer, the EPROM cell comprising:
   a control transistor, having a floating gate comprising a first portion of the polysilicon layer;
   an EPROM transistor, having a floating gate comprising a second portion of the polysilicon layer physically isolated from the first portion of the polysilicon layer; and
   an electrical interconnection, comprising a portion of the conductive layer, interconnecting the floating gate of the control transistor and the floating gate of the EPROM transistor.

2. An EPROM cell in accordance with claim 1, wherein the control transistor comprises a first control terminal and a second control terminal, and further comprising an electrical interconnection between the first and second control terminals.

3. An EPROM cell in accordance with claim 2, wherein the electrical interconnection between the first and second control terminals comprises a resistance.

4. An EPROM cell in accordance with claim 1, wherein the control transistor comprises a first control terminal and a second control terminal, and the EPROM transistor comprises a drain, and further comprising an electrical interconnection between the second control terminal of the control transistor and the drain of the EPROM transistor.

5. An EPROM cell in accordance with claim 4, wherein the electrical interconnection between the second control terminal of the control transistor and the drain of the EPROM transistor comprises a resistance.

6. An EPROM cell in accordance with claim 1, wherein the control transistor comprises a first control terminal and a second control terminal, and the EPROM transistor comprises a drain, and further comprising an electrical interconnection between the first and second control terminals of the control transistor and the drain of the EPROM transistor.

7. An EPROM cell in accordance with claim 6, wherein the electrical interconnection between the first and second control terminals of the control transistor and the drain of the EPROM transistor includes a resistance.

8. An EPROM cell in accordance with claim 1, wherein a programming charge applied to the floating gate of the EPROM transistor is cumulative, such that the EPROM cell can be successively charged to store cumulative values.

9. An EPROM cell in accordance with claim 1, wherein the control transistor includes a drain connection, and the EPROM transistor includes a source connection, and further comprising an input line, connected to the drain connection of the control transistor, whereby programming signals can be provided to the EPROM transistor.

10. An EPROM cell in accordance with claim 9, further comprising a drive transistor, having a drain connected to the source of the EPROM transistor, a gate of the drive transistor being associated with a precharge line, a select line, and a data line of an array of firing cells, whereby programming and reading of the EPROM cell can be controlled by signals sent through the input line and through the precharge line, the select line, and the data line.

11. An EPROM cell in accordance with claim 1, wherein the EPROM cell comprises a pen identification memory element.

12. An ink jet printhead having a plurality of ink jet nozzles, comprising:
a printhead control circuit, having an array of firing cells configured to control actuation of the ink jet nozzles, the control circuit having a semiconductor substrate, one and only one polysilicon layer disposed above the substrate, and a conductive layer disposed above the polysilicon layer; and
an array of EPROM cells disposed on the substrate in rows and columns, each EPROM cell including
a control transistor, having a floating gate comprising a first portion of the polysilicon layer;
an EPROM transistor, having a floating gate comprising a second portion of the polysilicon layer physically isolated from the first portion of the polysilicon layer; and
an electrical interconnection, comprising a portion of the conductive layer, interconnecting the floating gate of the control transistor and the floating gate of the EPROM transistor.

13. An ink jet printhead in accordance with claim 12, wherein the control transistor of each EPROM cell includes a first control terminal, and further comprising an input line, connected to the first control terminal of the control transistor, whereby programming signals can be provided to the EPROM transistor.

14. An ink jet printhead in accordance with claim 13, wherein the EPROM transistor includes a source connection, and the control circuit further comprises a column control transistor having a drain, associated with each column, and a row control transistors associated with each EPROM cell, each row control transistor having
a drain, connected to the source connection of the EPROM transistor,
a source, connected to the drain of the column control transistor in the column of the respective row control transistor, and
a gate, connected to a row control line, whereby programming and reading of the EPROM cells can be controlled by signals sent through the row control transistors and the column control transistor.

15. An ink jet printhead in accordance with claim 12, wherein the control transistor comprises a first control terminal and a second control terminal, and the EPROM transistor comprises a drain, and further comprising an electrical interconnection between at least two of the first and second control terminals of the control transistor and the drain of the EPROM transistor.

16. An ink jet printhead in accordance with claim 15, wherein the electrical interconnection between at least two of the first and second control terminals of the control transistor and the drain of the EPROM transistor includes a resistance.

17. An ink jet printhead in accordance with claim 12, wherein a programming charge applied to the floating gate is cumulative, such that each EPROM cell can be independently successively charged to store cumulative values.

18. A printhead control circuit for an inkjet printer having a plurality of pens, comprising:
a circuit structure including exactly one polysilicon layer, comprising an array of firing cells, configured to control actuation of ink jet nozzles in the inkjet printer, and a plurality of pen identification memory elements, each pen identification memory element comprising an EPROM cell, including
a control transistor having a floating gate comprising a first portion of the polysilicon layer, and
an EPROM transistor, having a floating gate comprising a second portion of the polysilicon layer, the floating gate of the EPROM transistor being electrically coupled to the floating gate of the control transistor.

19. A printhead control circuit in accordance with claim 18, wherein the control transistor comprises a first control terminal and a second control terminal, and the EPROM transistor comprises a drain, and further comprising an electrical interconnection between at least two of the first and second control terminals of the control transistor and the drain of the EPROM transistor.

20. A printhead control circuit in accordance with claim 18, wherein a programming charge applied to the floating gate of the EPROM transistor is cumulative, such that each EPROM cell can be independently successively charged to store cumulative values.

* * * * *

UNITED STATES PATENT AND TRADEMARK OFFICE
CERTIFICATE OF CORRECTION

| | |
|---|---|
| PATENT NO. | : 7,365,387 B2 |
| APPLICATION NO. | : 11/360801 |
| DATED | : April 29, 2008 |
| INVENTOR(S) | : Trudy Benjamin |

Page 1 of 1

It is certified that error appears in the above-identified patent and that said Letters Patent is hereby corrected as shown below:

In column 18, lines 14-15, in Claim 14, delete "transistors" and insert -- transistor --, therefor.

Signed and Sealed this

Twenty-second Day of July, 2008

JON W. DUDAS
*Director of the United States Patent and Trademark Office*